United States Patent
Lea et al.

(10) Patent No.: US 6,239,404 B1
(45) Date of Patent: May 29, 2001

(54) PLASMA PROCESSING APPARATUS

(75) Inventors: Leslie Michael Lea, Oxfordshire; Edward Guibarra, Cardiff, both of (GB)

(73) Assignee: Surface Technology Systems Limited, Gwent (GB)

( * ) Notice: Subject to any disclaimer, the term of this patent is extended or adjusted under 35 U.S.C. 154(b) by 0 days.

(21) Appl. No.: 09/462,147

(22) PCT Filed: Jul. 6, 1998

(86) PCT No.: PCT/GB98/01769
§ 371 Date: Mar. 8, 2000
§ 102(e) Date: Mar. 8, 2000

(87) PCT Pub. No.: WO99/01887
PCT Pub. Date: Jan. 14, 1999

(30) Foreign Application Priority Data

Jul. 5, 1997 (GB) .................................................. 9714142

(51) Int. Cl.$^7$ .................................................. B23K 10/00
(52) U.S. Cl. .............................. 219/121.54; 219/121.57; 219/121.43; 315/111.51
(58) Field of Search ................... 219/121.54, 121.43, 219/121.57, 121.4; 315/111.51; 156/345; 118/723 I, 723 MP

(56) References Cited

U.S. PATENT DOCUMENTS

| 5,147,493 | * | 9/1992 | Nishimura et al. | 156/345 |
| 5,565,074 | * | 10/1996 | Qian et al. | 204/298.08 |
| 5,573,595 | * | 11/1996 | Dible | 118/723 I |
| 5,965,034 | * | 10/1999 | Vinogradov et al. | 216/68 |

FOREIGN PATENT DOCUMENTS 9-106979 * 4/1997 (JP) .

* cited by examiner

Primary Examiner—Mark Paschall
(74) Attorney, Agent, or Firm—Jones Volentine, LLC

(57) ABSTRACT

Plasma processing apparatus frequently incorporates an antenna fed from a power supply and in this invention a power supply feeds a conventional matching circuit (10), which in turn is connected to the primary (11) of a transformer (12). The antenna (15) is coupled across the secondary winding (13) of the transformer (12) and that winding is tapped to ground at (16). This creates a virtual earth (17) near the mid point of the antenna (15) significantly reducing the variation, along the length of the antenna, in the power supplied to the plasma.

8 Claims, 5 Drawing Sheets

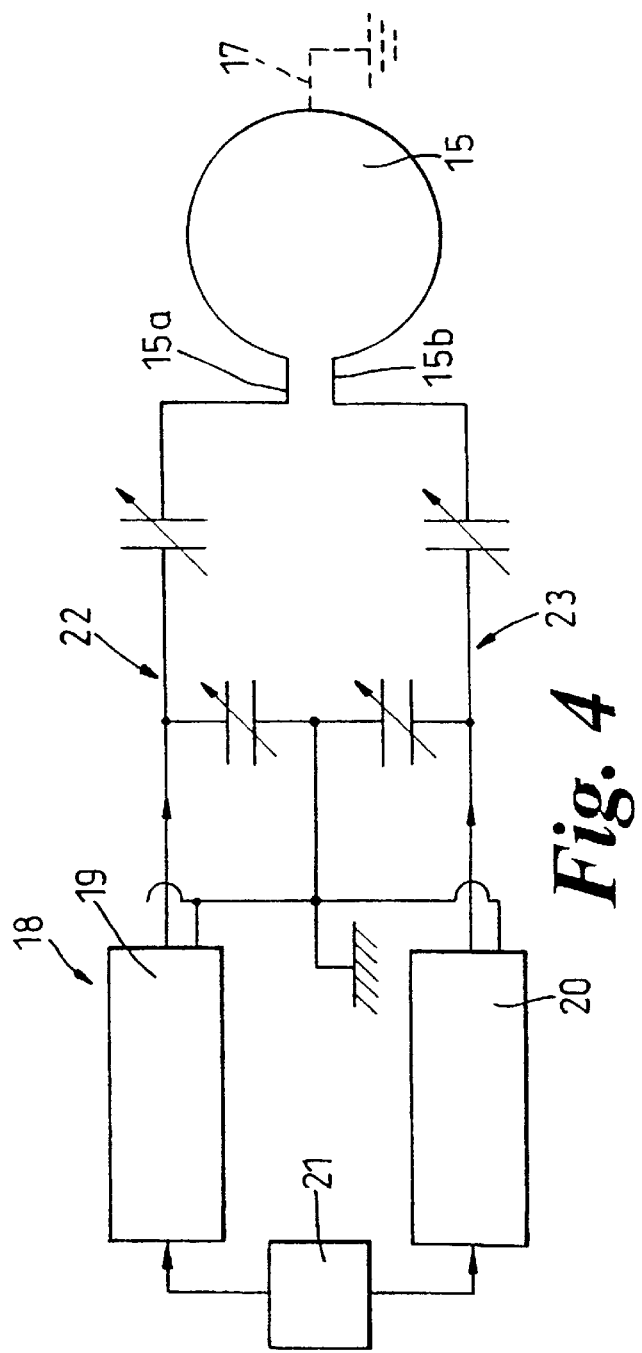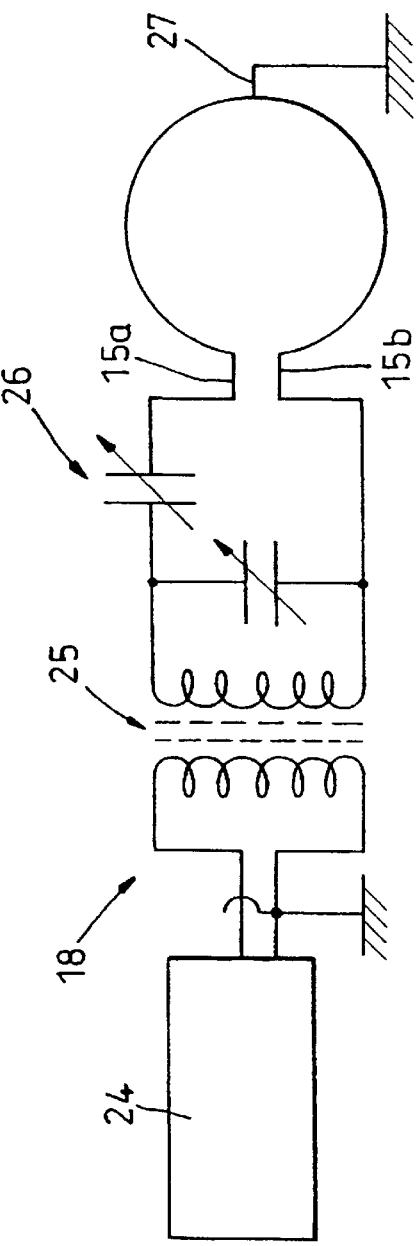

PLASMA PROCESSING APPARATUS

This invention relates to plasma processing apparatus and apparatus in which ions are extracted from a plasma source. Plasma processing apparatus is used extensively in the fabrication of semiconductor devices and in many other processes in which the deposition of coatings or the etching of surfaces is required. Particularly when these processes are being carried out on a production scale, uniformity between batches becomes very important.

Generally such plasmas are generated in a vacuum chamber, and it is preferred that the means for generating the plasma is either located outside of the chamber or within a protective wall, in order to reduce the disturbance to the plasma potential when radio frequency power is applied. When the radio frequency power is inductively coupled into the plasma, the antenna used for this purpose is either located within the chamber and encased by a dielectric material or outside of the chamber adjacent to a portion of the wall which is constructed out of dielectric material. The antenna then effectively forms the primary of a transformer of which the secondary is the plasma within the source.

A plasma source may utilise one or more antennae, and if located outside of the source, each will be located adjacent to dielectric sections of the sides or the top. A single antenna may take the form of a flat spiral on the top of the source, or a multiple turn coil wound around the sides or the source, or a single turn coil located adjacent to either the top or sides of the source, or other forms not detailed here. The dielectric section of the source may be re-entrant with the antenna placed within the profile. When multiple antennae are used, they may be located adjacent to separate dielectric sections of the source, or wound separately, but adjacent to the same dielectric section.

In most inductively coupled plasma systems, the antennae are driven so that one end or termination of each antenna is grounded and the other end is connected with the output of the impedance matching unit. This is generally a very effective technique for producing a dense plasma, however, there is the disadvantage that a high RF voltage is applied to the driven end or termination of the antenna. This leads to capacitive coupling of RF power to the plasma near this end of the antenna, the magnitude of the voltage an the capacitive coupling steadily reducing towards the grounded end of the antenna. The inductive power coupling is effectively constant along the antenna and therefore there is a non-uniform overall coupling of power (inductive+capacitive) into the plasma as a function of position along the antenna. This has the potential for producing a plasma which is not spatially uniform, leading to reduced uniformity in the plasma processing application. Methods have been adopted in commercial plasma processing systems to reduce the capacitive coupling element and therefore to partially overcome this significant inhomogeneity. For example, the use of a grounded electrostatic shield between the antenna and the dielectric window, with appropriate slots to permit effective inductive coupling of power to the plasma. This is used, for example by Prototech Research Inc.

From one aspect the invention consists in plasma processing apparatus including a chamber, an antenna for inducing a plasma and an alternating current supply means for supplying power to the antenna via its terminations chracrerised in that the power supply means provides substanially 180° out-of-phase inputs on the terminations of the antenna.

The power supply means may include a power supply and a transformer fed by the power supply and the antenna may be connected across at least part of the secondary winding of the transformer, the invention being further characterised in that a tapping of the secondary winding is grounded such that the antenna is effectively grounded intermediate its ends.

With a centrally tapped secondary winding and a single coil antenna, the antenna is effectively or virtually grounded at its centre point and the voltage excursion of each end of the coil with respect to ground may be effectively halved when compared with the voltage on the driven end of the conventional coil antenna. Improved spatial uniformity is produced in the plasma, which in turn leads to improved spatial uniformity in the processing of the semiconductor wafer or other work piece. In addition to the increase in the spatial uniformity of the plasma, a degree of impedance matching between the plasma and the RF power supply may be obtained by a suitable choice of the relative numbers of turns on the primary and secondary windings of the transformer.

Although the invention is most conveniently utilised and understood in terms of a single coil antenna, the other coil configurations described above and multiple antenna may also be utilised. It will be understood that with coils having more complex geometry, such as a spiral, the tapping point may be offset to achieve an offset 'grounding' of the coil, although the desired ground point will be generally midway between the terminations of the antenna. The correct point can be determined empirically by adjusting the tapping point to substantially minimise the voltage excursions at the terminations of the antenna.

Other ways of achieving a substantially 180° out-of-phase power input on the terminations of the antenna can be utilised and may be more advantageous in certain circumstances. Thus the power supply means may include separate power supplies connected to respective inputs of the antenna and these power supplies may be linked by a phase lock loop to maintain the power supplies out of phase one to the other. This arrangement is particularly useful when high power is required and is able to operate over a wide range of frequencies. Preferably respective matching circuits are included between the power supplies and their respective antenna terminations.

In an alternative approach, the power supply means may included a power supply, a transformer and a matching circuit and the antenna may be earthed intermediate its ends. To achieve 180° out-of-phase inputs, the earthing needs to be at or adjacent the midway point between the terminations of the antenna, just as the effective or virtual grounding discussed above.

In the still further alternative, the power supply means may include a variable matching circuit for matching the plasma and impedance to the output impedance of the power supply whereby substantially 180° out-of-phase inputs to the formations are achieved.

From the still further aspect the invention consists in a plasma processing apparatus including a chamber, and antenna for inducing a plasma and power supply means characterised in that the power supply means induces a virtual or effective ground intermedate the terminations of the antenna.

From yet another aspect the invention consists in plasma processing apparatus including a chamber, and an antenna for inducing plasma in the chamber and an alternating current supply means for feeding the antenna characterised in that the power supply means includes a power supply and a transformer fed by the power supply, in that the antenna is connected over at least part of the secondary winding of the transformer and a tapping of the secondary winding is grounded such that the antenna is effectively grounded intermediate its terminations.

The invention may be performed in various ways and a specific embodiment will now be described by way of example with reference to the following drawings, in which;

FIGS. 4, 5 and 6 are circuit diagrams of respective alternative feeding arrangements for the antenna.

Figure 1:
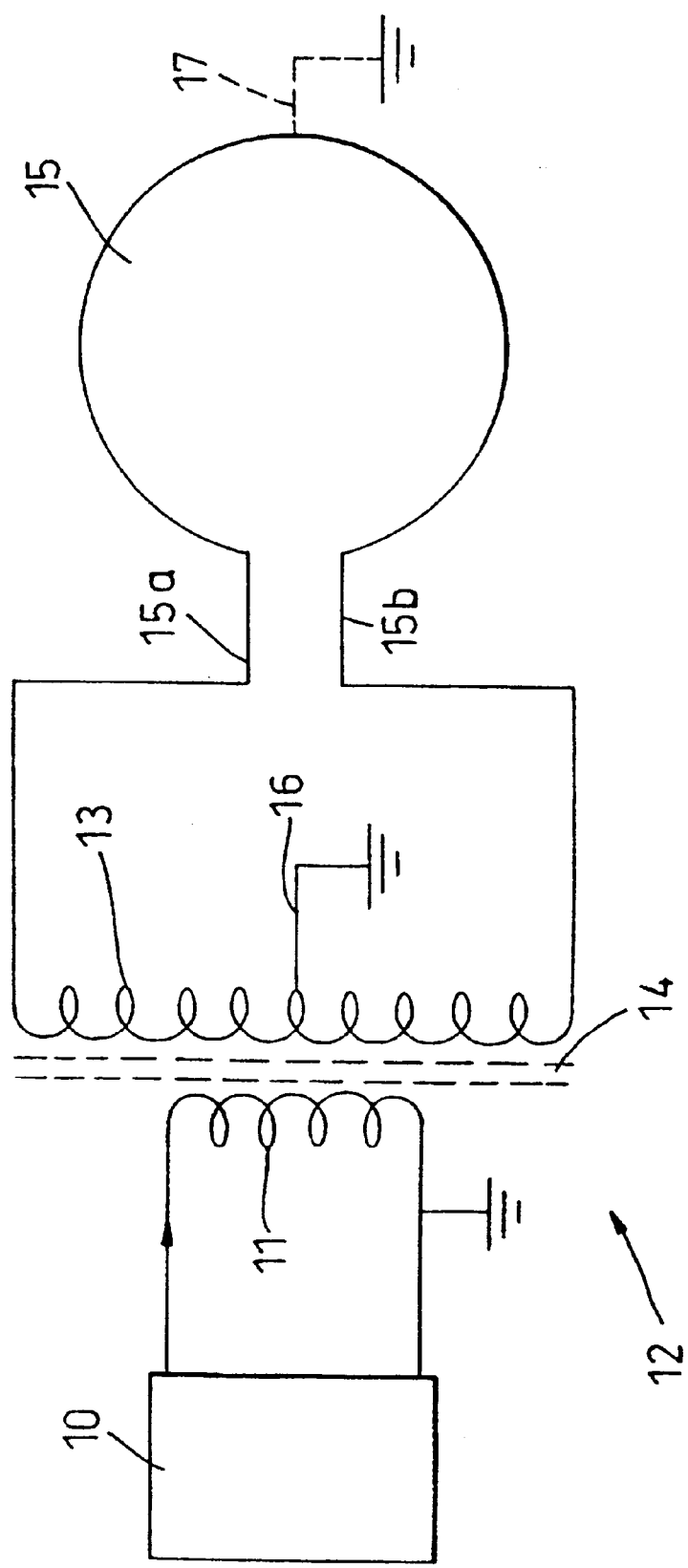
FIG. 1 is a schematic circuit diagram illustrating the feeding of a single turn antenna.

In the application shown in FIG. 1, a conventional matching circuit 10 feeds the primary 11 of a transformer 12 from a power supply. The transformer 12 consists of primary 11 and secondary winding 13 wound on an annular ferrite core 14. Each winding 11,13 comprises a number of separate conductors to increase the conductor surface area and therefore the current carrying capability at RF frequencies. An antenna 15 is connected by its terminations 15a,b across the winding 13, which is in turn tapped to ground at 16. This creates a virtual earth at 17 because the voltages at the terminations 15a,15b of the antenna 15 are 180° out of place with each other.

Figure 2:
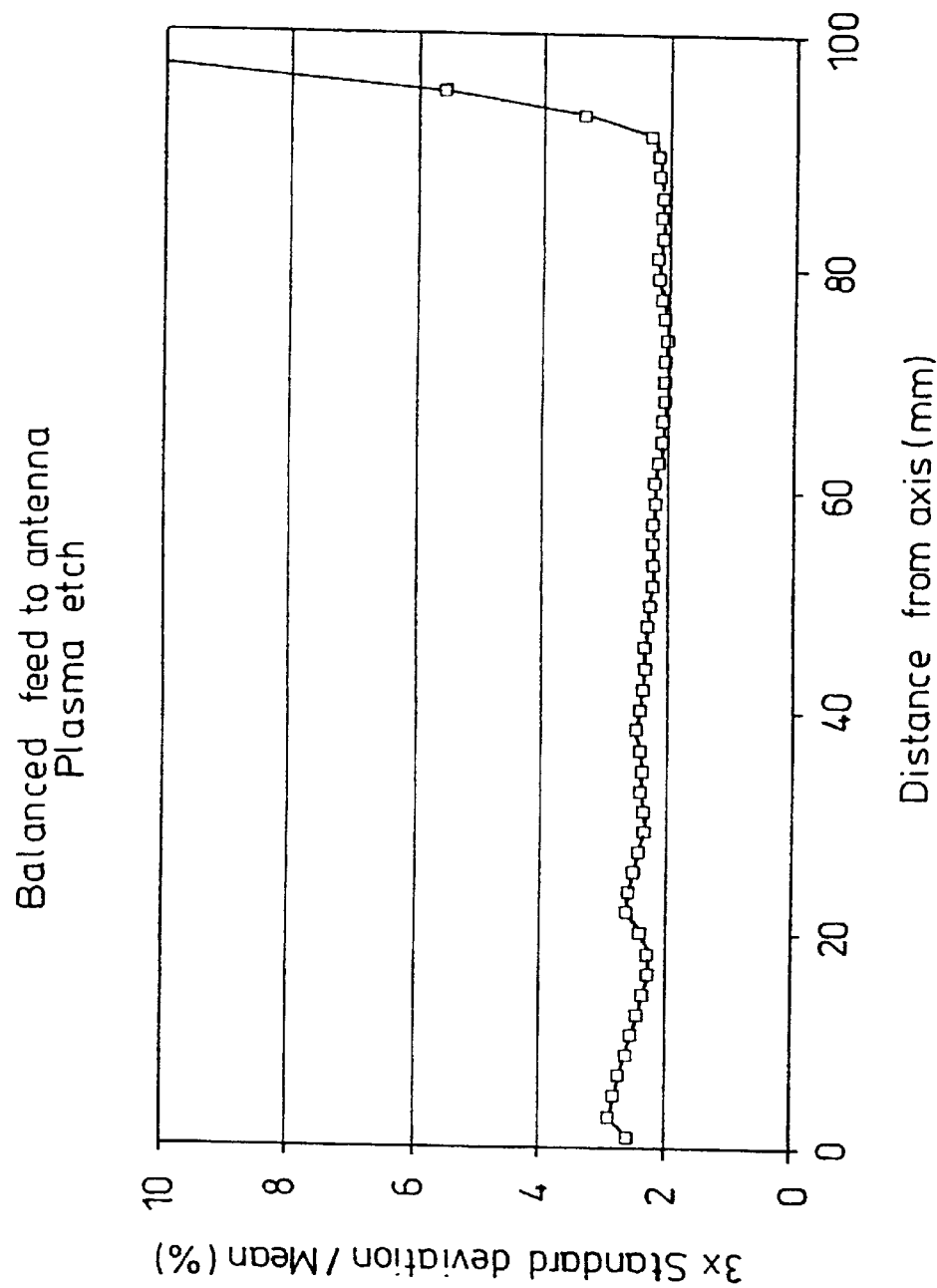
FIG. 2 is a graph illustrating the standard deviation of etch rate as a percentage of mean etch rate using the set up of FIG. 1.
Figure 3:
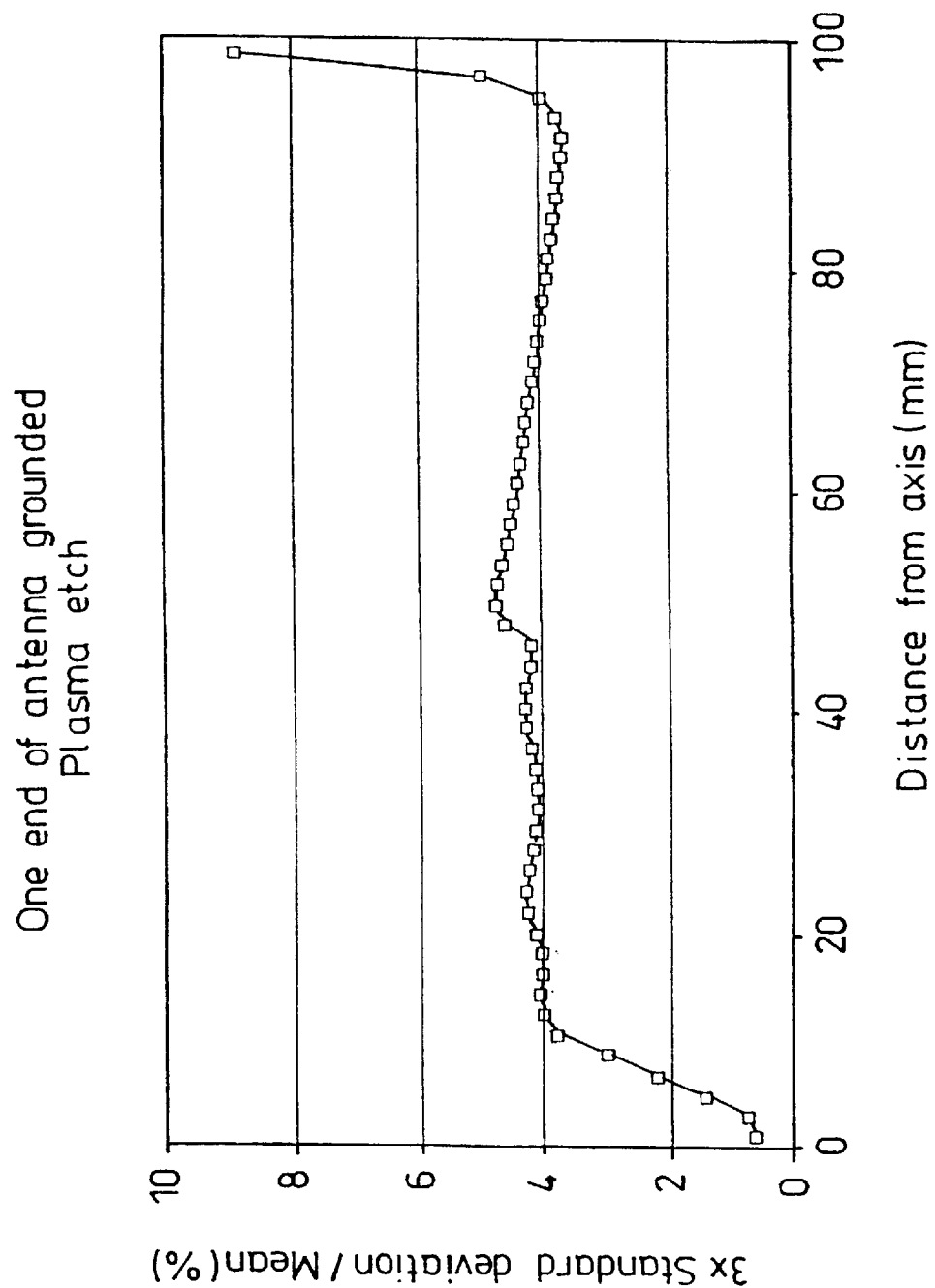
FIG. 3 is a comparable graph to FIG. 2 for the conventional arrangement described in the preamble of the specification.

Results have been obtained with this balanced feed transformer system operated at a frequency of 13.56 MHz, but this does not preclude its use at higher or lower RF frequencies. Experimental results obtained during an ion assisted etch, using a transformer of the type described above, are presented in FIG. 2. The data shows the standard deviation in the etch rate as a percentage of the mean etch rate, both calculated from the origin to the point, as a function of distance from the centre of the workpiece. For comparison, results are shown in FIG. 3, which were obtained with a conventional coil antenna which was grounded at one end. A significant improvement in the spatial uniformity of the process is visible in the results obtained using the balanced feed arrangement.

Due to losses in the transformer core and ohmic losses in the windings, the absolute value of the etch rate with the transformer present is typically slightly less than when it is not used, however, this may be countered by increasing the power from the RF supply, and is likely to be an acceptable loss in return for the improved process uniformity.

In FIG. 4 power supply means 18 comprise a pair of parallel power supplies 19, 20 which are interconnected by a phase lock loop 21 and are provided with linked respective matching circuits 22, 23 to feed respective antenna terminations 15a and 15b. The phase lock loop 21 is arranged to maintain the outputs of the power supplies 19 and 20 180° out-of-phase so that the voltages at 15a and 15b are also 180° out-of-phase, with the result that the mid point of the antenna 15 is effectively grounded at 17. This arrangement is particularly suitable where high powers are required and also where high frequencies are needed.

In FIG. 5 the power supply means 18 consists of a single power supply 24 which feeds a transformer 25, which is in turn connected to a matching circuit 26 and hence to terminations 15a, 15b. The mid point of the antenna 15 is grounded at 27 and so effectively forces the terminations 15a, 15b to be out-of-phase as previously discussed.

Figure 6:
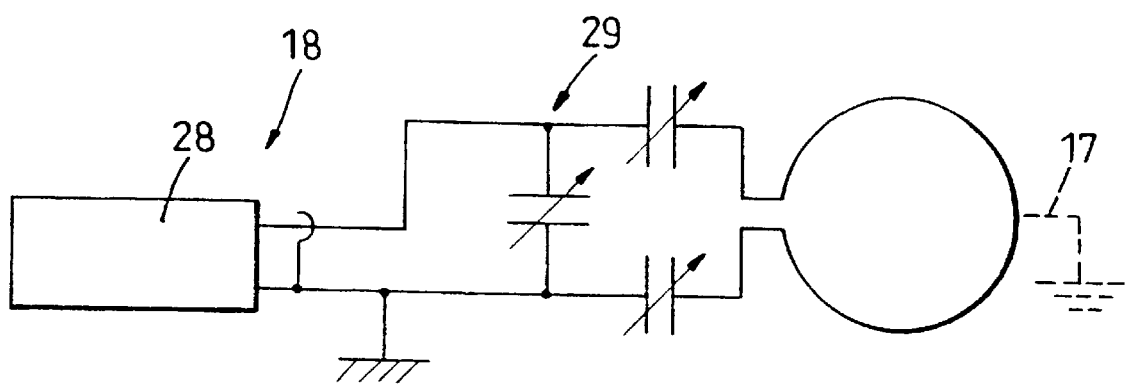

In FIG. 6, the power supply means 18 comprises a power supply 28 and a variable capacitive matching circuit 29. In this arrangement, by altering the capacitance of the variable capacitors in the matching circuit 29, it is possible to arrange for the inputs on the terminations 15a and 15b to be approximately 180° out-of-phase. As there is no transformer in this arrangement, the power losses are less than in the FIGS. 1 and 5 layouts, but this circuit may be a little less stable and the virtual earth may hunt around the mid-point 17. In certain apparatus this may be beneficial.

The power supplies mentioned above will usually be RF power supplies and it should be noted that the transformers may be balun or other suitable transformer rather than the simple primary/secondary arrangements shown in the drawings.

Figure 7:
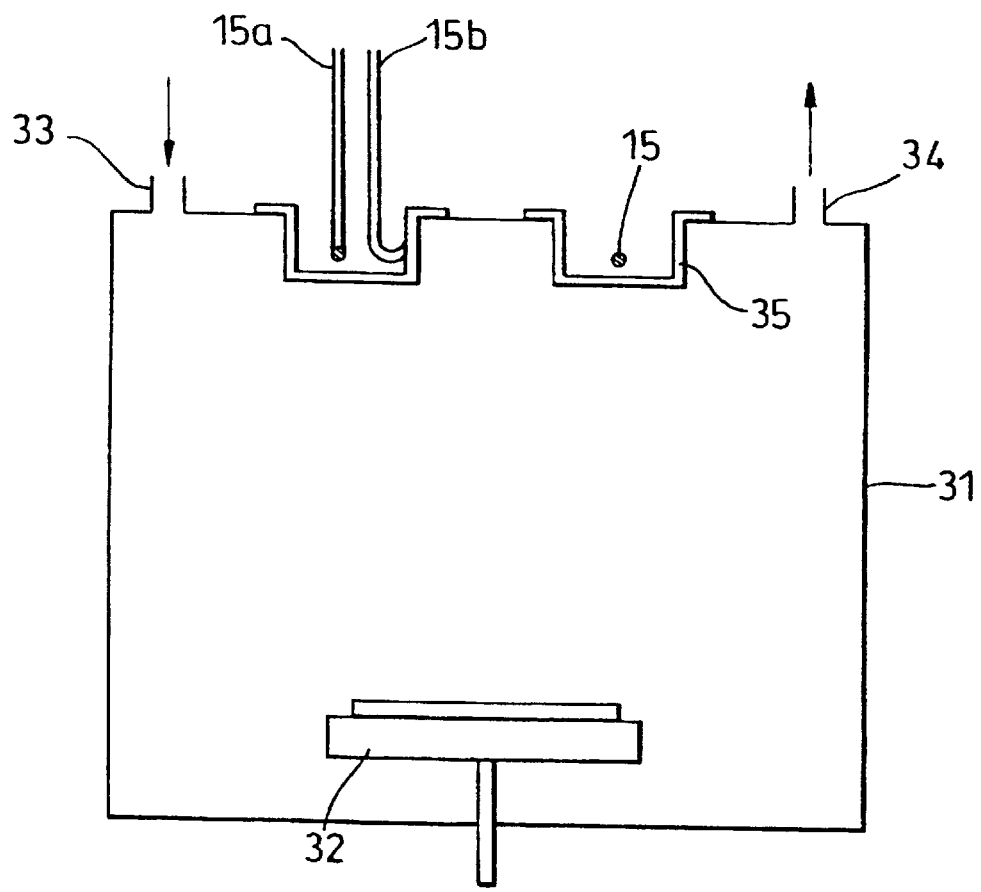
FIG. 7 is schematic diagram of a plasma processing apparatus demonstrating the use of the antenna.

FIG. 7 illustrates, schematically, the type of plasma processing apparatus 30 in which the antenna 15 may be used. It includes a reactor chamber 31, a workpiece support 32, a gas inlet 33 and a gas outlet 34. The antenna 15 sits in an annular dielectric cup 35.

What is claimed is:

1. A plasma processing apparatus, comprising:

a chamber;

an antenna for inducing a plasma; and an alternating current power supply means for supplying power to the antenna via its terminations, wherein the power supply means includes a power supply and a transformer fed by the power supply, and wherein the antenna is connected across at least part of the secondary winding of the transformer and a tapping of the secondary winding is grounded such that the antenna is effectively grounded intermediate its terminations, such that the power supply means provides substantially 180° degrees out-of-phase inputs on the terminations of the antenna.

2. A plasma processing apparatus, comprising:

a chamber;

an antenna for inducing a plasma; and an alternating current power supply means for supplying power to the antenna via its terminations, wherein the power supply means includes a power supply, a transformer and a matching circuit and wherein the antenna is earthed intermediate its ends, such that the power supply means provides substantially 180° degrees out-of-phase inputs on the terminations of the antenna.

3. A plasma processing apparatus, comprising:

a chamber;

an antenna for inducing a plasma; and an alternating current power supply means for supplying power to the antenna via its terminations, wherein the power supply means includes a power supply and a circuit to match the impedance of the plasma to the impedance of the power supply means such that substantially 180° out-of-phase inputs are achieved on the terminations of the antenna.

4. A plasma processing apparatus, comprising:

a chamber;

an antenna for inducing a plasma in the chamber; and an alternating current power supply, wherein the alternating current power supply induces a virtual or effective ground intermediate the terminations of the antenna.

5. A plasma processing apparatus as claimed in claim 4, wherein the antenna is effectively grounded at or adjacent the mid-point between its terminations.

6. A plasma processing apparatus, comprising:

a chamber;

an antenna for inducing a plasma in the chamber; and an alternating current power supply means for feeding the antenna, wherein the power supply means includes a power supply and a transformer fed by the power supply, and wherein the antenna is connected over at least part of the secondary winding of the transformer and a tapping of the secondary winding is grounded such that the antenna is effectively grounded intermediate its terminations.

7. A plasma processing apparatus as claimed in claim 6, wherein the antenna is effectively grounded at or adjacent the mid-point between its terminations.

8. A plasma processing apparatus, comprising:

a chamber;

an antenna for inducing a plasma; and an alternating current power supply means for supplying power to the antenna via its terminations, wherein the power supply means provides substantially 180° degrees out-of-phase inputs on the terminations of the antenna, and wherein the antenna is effectively grounded at or adjacent the mid-point between its terminations.

\* \* \* \* \*